United States Patent
Baringer et al.

(10) Patent No.: US 9,621,183 B2
(45) Date of Patent: Apr. 11, 2017

(54) INTERLEAVED Δ-Σ MODULATOR

(71) Applicant: HRL LABORATORIES LLC, Malibu, CA (US)

(72) Inventors: Cynthia D. Baringer, Piedmont, CA (US); Zhiwei A. Xu, Davis, CA (US); Peter Petre, Oak Park, CA (US); Donald A. Hitko, Grover Beach, CA (US); Albert Cosand, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/745,354

(22) Filed: Jun. 19, 2015

(65) Prior Publication Data
US 2016/0020781 A1    Jan. 21, 2016

Related U.S. Application Data

(60) Provisional application No. 62/015,021, filed on Jun. 20, 2014.

(51) Int. Cl.
*H03M 3/00* (2006.01)
*H03M 1/06* (2006.01)

(52) U.S. Cl.
CPC .............. *H03M 3/47* (2013.01); *H03M 1/066* (2013.01); *H03M 3/37* (2013.01); *H03M 3/454* (2013.01)

(58) Field of Classification Search
CPC .......... H03M 3/468; H03M 1/12; H03M 3/30; H03M 1/1225; H03M 3/38; H03M 3/486
USPC ........................................ 341/143, 155, 161
See application file for complete search history.

(56) References Cited

U.S. PATENT DOCUMENTS

| | | | | |
|---|---|---|---|---|
| 5,729,230 A * | 3/1998 | Jensen | ................. | H03M 3/396 341/118 |
| 6,693,573 B1 * | 2/2004 | Linder | ................. | H03M 3/408 341/143 |
| 7,016,421 B2 * | 3/2006 | Yap | .......................... | G02F 7/00 341/137 |
| 7,561,635 B2 * | 7/2009 | Norsworthy | .......... | H03M 3/392 341/143 |
| 7,564,391 B2 * | 7/2009 | Das | ........................ | H03M 3/42 341/118 |

(Continued)

OTHER PUBLICATIONS

International Search Report and Written Opinion (ISR & WO) for PCT/US2015/036833, mailed on Oct. 13, 2015.

(Continued)

*Primary Examiner* — Linh Nguyen
(74) *Attorney, Agent, or Firm* — Ladas & Parry

(57) ABSTRACT

A delta sigma modulator which has improved the dynamic range. The ΔΣ modulator has a plurality of ADCs and a plurality of DACs, the plurality of ADCs and DACs are connected in a loop. The plurality of ADCs are coupled with an incoming analog signal. A clock generator provides a plurality of clock signals which control the plurality of ADCs and the plurality of DACs, the clock signals being offset relative to each other in the time domain thereby enabling each ADC in the plurality of ADCs one at a time and each DAC in the plurality of DACs one at a time so that the ΔΣ modulator processes data in the incoming analog signal in an interleaved fashion. The delta sigma modulator has an Nth order filter in a forward path of the loop.

28 Claims, 14 Drawing Sheets

(56) References Cited

U.S. PATENT DOCUMENTS

| | | | | |
|---|---|---|---|---|
| 7,675,444 | B1* | 3/2010 | Smith | H04L 25/0266 341/141 |
| 8,436,757 | B2* | 5/2013 | San | H03M 3/368 341/143 |
| 8,659,453 | B1* | 2/2014 | Low | H03M 1/0658 341/110 |
| 2002/0093441 | A1 | 7/2002 | Wiesbauer et al. | |
| 2002/0118128 | A1* | 8/2002 | Siferd | H03M 3/47 341/141 |
| 2005/0190091 | A1 | 9/2005 | Koc et al. | |
| 2008/0227424 | A1* | 9/2008 | Muhammad | H03M 1/183 455/341 |
| 2008/0272946 | A1 | 11/2008 | Melanson | |
| 2008/0291069 | A1* | 11/2008 | Inukai | H03M 3/32 341/143 |
| 2010/0117881 | A1* | 5/2010 | Baker | H03M 3/47 341/143 |
| 2010/0331039 | A1* | 12/2010 | Hezar | H03M 3/47 455/550.1 |
| 2011/0291868 | A1* | 12/2011 | Kehl | H03M 1/1076 341/120 |
| 2012/0062405 | A1* | 3/2012 | Loeda | H03M 3/37 341/143 |
| 2012/0133536 | A1 | 5/2012 | Lai et al. | |
| 2013/0021180 | A1 | 1/2013 | Shabra et al. | |
| 2014/0077978 | A1* | 3/2014 | Huynh | H03M 3/41 341/110 |

OTHER PUBLICATIONS

Candy, James C. and Temes, Gabor C., "Oversampling Delta-Sigma Data Converters: Theory, Design, and Simulation, 1st Edition," 1992, pp. 1-16 (19 pages).

Lu, Chun-Yao, et al., "A High-Resoluion Time-Interleaved Delta-Sigma Modulator with Low Oversampling", Proc. of the International Symposium on Integrated Circuits, (ISIC), Dec. 2009, pp. 5-8.

Galton, Ian, "Why Dynamic-Element-Matching DACs Work," IEEE Transactions on Circuits and Systems—II: Express Briefs, vol. 57, No. 2, Feb. 2010, pp. 69-74.

Reekmans, Stijn, "Quadrature Mismatch Shaping for Digital-to-Analog Converters," IEEE Transactions on Circuits and Systems—I: Regular Papers, vol. 53, No. 12, Dec. 2006, pp. 2529-2538.

Ryckaert, Julien et al., "A 6.1 GS/s 52.8 mW 43 dB DR 80 MHz Bandwidth 2.4 GHz RF Bandpass ΔΣ ADC in 40 nm CMOS" IEEE Radio Frequency Integrated Circuits Symposium (RFIC), May 2010, pp. 443-446.

* cited by examiner

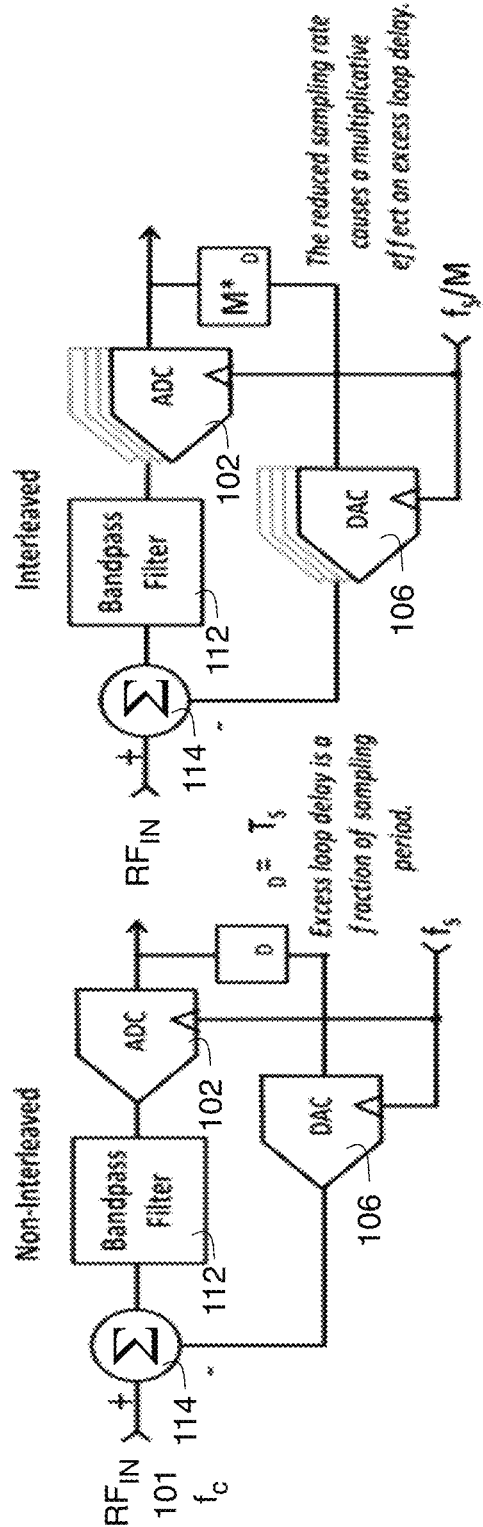

125 →

INTERLEAVED Δ-Σ MODULATOR

CROSS REFERENCE TO RELATED APPLICATIONS

This application claims the benefit of U.S. Provisional Patent Application Ser. No. 62/015,021 filed Jun. 20, 2014 and entitled "Interleaved Delta-Sigma Modulator", the disclosure of which is hereby incorporated herein by reference.

STATEMENT REGARDING FEDERALLY SPONSORED RESEARCH OR DEVELOPMENT

None.

TECHNICAL FIELD

This invention relates to an interleaved Delta-Sigma ($\Delta\Sigma$) modulator with improved characteristics. The inventor also relates to a Delta-Sigma ($\Delta\Sigma$) Analog to Digital Convertor (ADC) which utilizes the aforementioned interleaved Delta-Sigma ($\Delta\Sigma$) modulator.

BACKGROUND

A Delta-Sigma ($\Delta\Sigma$) modulator removes noise in a signal band of interest so that when the desired signal is received, the dynamic range within the signal band is improved. The dynamic range is measured as the difference between the received signal and noise floor as given in dBm. Removing the noise, or more specifically re-shaping the noise, out of the signal band increases the notch depth which is the same as lowering the noise floor. It is easier to remove the noise for deeper notch characteristics in narrow band applications (~1 MHz) so a very high dynamic range (100 dB) can then be achieved. Conversely for wider signal bandwidths (~200 MHz), more shallow notches are obtained which result in less dynamic range (60 dB).

A Delta-Sigma ($\Delta\Sigma$) modulator is often used as an important part of a Analog to Digital Converter to lower the noise floor for a analog signal of interest. Such an Analog to Digital Converter is commonly called a Delta-Sigma Analog to Digital Converter.

Performance of a Delta-Sigma ($\Delta\Sigma$) modulator is strongly tied to the clock rate because (i) increasing the ratio of clock rate to signal bandwidth improves dynamic range, and (ii) faster sampling is necessary for bandpass operation at high signal frequencies. Increasing the clock rate, however, imposes even harder design challenges on the quantizers within the modulator. The architecture of the disclosed $\Delta\Sigma$ modulator leverages interleaving concepts to relax the quantizer clock rate (of the internal ADCs and DACs) without changing the effective oversampling ratio, thus, making it easier to reach aggressive dynamic range goals across wider bandwidths at higher frequencies than has been done in the prior art.

Traditional software-based (or software-defined) receiver architectures have extra conversion stages to reduce the Radio Frequencies (RF) down to a frequency that can be supported by a high-resolution ADC. These solutions have added complexity, size, power, and cost to the software-based receiver. Furthermore, traditional hardware based receivers have limited cross-functionality and can only be modified through physical intervention. Thus, the evolution in receiver design has been towards software-based receiver architectures due to their programmability and design efficiency but preferably without sacrificing performance of traditional hardware based receivers. The $\Delta\Sigma$ modulator has emerged as a preferred candidate for the front-end ADC in these software-based receiver architectures. However, attaining a high dynamic range (for example, a dynamic range of 80+ dB) at input signal frequencies (for example, frequencies above 1 GHz) has not yet been achieved.

The $\Delta\Sigma$ modulator architecture disclosed herein interleaves the multi-bit quantizers to maintain a fast effective sampling rate—thus supporting higher frequencies of operation—but the sampling rate of each quantizer is reduced by the interleaving factor thus enabling higher dynamic range performance.

Time-interleaving of two delta-sigma modulators has been published most recently by Chun-Yao Lu, "A High-Resolution Time-Interleaved Delta-Sigma Modulator with Low Oversampling", *Proc. of the International Symposium on Integrated Circuits*, (ISIC), December 2009 for use in audio applications. The two modulators are coupled together with additional analog paths for compensation similar to what is shown in FIG. 1(*a*) which is a simplified representation of the teachings of this prior art. The architecture presented can theoretically reduce the sampling rate by a factor of four and increase the dynamic range when compared to a conventional modulator. However, the prior art approach of this paper is effectively limited to low frequency operation because, in practice, a slight mismatch between the even and odd paths depicted in FIG. 1(*a*) (and in FIG. 4 of that paper) could dramatically degrade the dynamic range of that modulator.

Another bandpass $\Delta\Sigma$ modulator architecture with partial interleaving has been designed for high-IF operation as taught by Julien Ryckaert et al., "A 6.1 GS/s 52.8 mW 43 dB DR 80 MHz Bandwidth 2.4 GHz RF Bandpass $\Delta\Sigma$ ADC in 40 nm CMOS" *IEEE Radio Frequency Integrated Circuits Symposium* (RFIC), May 2010. See FIG. 1(*b*). The ADC in the forward path of the modulator has been interleaved to relax the speed of the clock. The output quantized data is then multiplexed back up to the system data rate for conversion to the analog error signal by a single DAC. The ADC and DAC are not multi-bit quantizers, but rather single bit quantizers, and are limiting the achievable dynamic range for the chosen order of the modulator. An extension of the published architecture to multi-bit levels would not necessarily achieve a commensurate increase in dynamic range since the DAC—non-interleaved and still operating at full clock rate—would limit the overall modulator performance. A pictorial view of the architecture is shown in FIG. 1(*b*) for comparison with other prior art and with the approach presented herein.

A 1-bit ADC is just a single comparator which drives a 1-bit DAC which is a single switchable current source. A 1-bit DAC is inherently linear and does not introduce non-linearity to the system. Theory shows that every additional bit in the ADC and DAC increases the dynamic range (DR) by 6 dB, however, at some point the non-linearity of a multi-bit DAC becomes an issue so adding more bits does not further increase dynamic range. The basic theory of delta-sigma demonstrates that the RMS noise goes as $2^{-K}$ where K is the number of quantizer bits. An example of a work covering this basic theory is James C. Candy and Gabor C. Temes, "*Oversampling Delta-Sigma Data Converters: Theory, Design, and Simulation*, 1st Edition," 1992, pages 1-16.

Interleaving both the multi-bit ADC and DAC, as proposed herein, is a substantially more difficult problem than that addressed in prior art. Meeting dynamic range goals requires matching among the interleaved DACs in addition to managing mismatch within an individual DAC. Also, interleaving increases the excess phase delay in the loop and therefor compensation is utilized to maintain stability. These challenges are difficult and may make the proposed solution appear infeasible to others but we have identified technical solutions that enable the new architecture.

BRIEF DESCRIPTION OF THE INVENTION

In one aspect the present invention provides a modulator having a forward path coupling an input summing block with a data out block, the forward path including at least a Nth order filter coupled to said input summing block and a plurality of interleaved multi-bit Analog to Digital Converters (ADCs), the interleaved multi-bit ADCs having inputs which are coupled to the Nth order filter and outputs which are coupled to the data out block, and a feedback path including a plurality of interleaved multi-bit Digital to Analog Converters (DACs), the interleaved multi-bit DACs having inputs which are coupled to respective outputs of the interleaved multi-bit ADCs, the interleaved multi-bit DACs having outputs which are summed together and applied to the input summing block. The concept of interleaving both ADCs and DACs allows a higher clock rate which enables higher input signal frequencies since the clock frequency has to be above the input frequency.

In another aspect the present invention provides a method increasing the dynamic range of a $\Delta\Sigma$ modulator, the method comprising; providing a plurality of ADCs and a plurality of DACs, the plurality of ADCs and DACs being connected in a loop; coupling the plurality of ADCs with an incoming analog signal; controlling said plurality of ADCs and plurality of DACs with a plurality of clock signals, the clock signals in said plurality of clock signals being offset relative to each other in the time domain thereby enabling each ADC in said plurality of ADCs one at a time and enabling each DAC in said plurality of DACs one at a time such that the $\Delta\Sigma$ modulator processes data in said incoming analog signal in an interleaved fashion.

BRIEF DESCRIPTION OF THE DRAWINGS

FIG. 1(*b*) depicts another $\Delta\Sigma$ modulator.

FIG. 3(*b*) illustrates that since the ADCs in the proposed interleaved designs have a sampled clock period that is multiplied by the interleaving order, the excess phase delay increases proportionally.

FIG. 3(*c*) is a block diagram for a low-pass continuous time $2^{nd}$ order delta-sigma modulator while FIG. 3(*d*) is a block diagram for a band-pass continuous time $2^{nd}$ order delta-sigma modulator.

FIGS. 4(*a*) and 4(*b*) include a timing diagram of the interleaved clocks and signals (FIG. 4(*b*)) and corresponds to the embodiment of FIG. 4 with FIG. 4(*a*) showing the signal correspondence therewith.

FIG. 5*a*-1 depicts a low speed DAC array used with the embodiment of FIG. 5*a*.

FIGS. 6*a*-1, 6*a*-2, 6*b*-1 and 6*b*-2 depict two schemes for subtracting the feedback signal for the input signal (FIGS. 6*a*-1 and 6*b*-1) and include more detailed corresponding possible circuit implementations (FIGS. 6*a*-2 and 6*b*-2).

FIG. 9(*a*) is a jitter plot showing the effect of clock jitter from a 5-GHz and 10-GHz clock source on the SNR of an ideal 3-bit DAC driven by a delta-sigma modulated signal.

DETAILED DESCRIPTION

Figure 2:
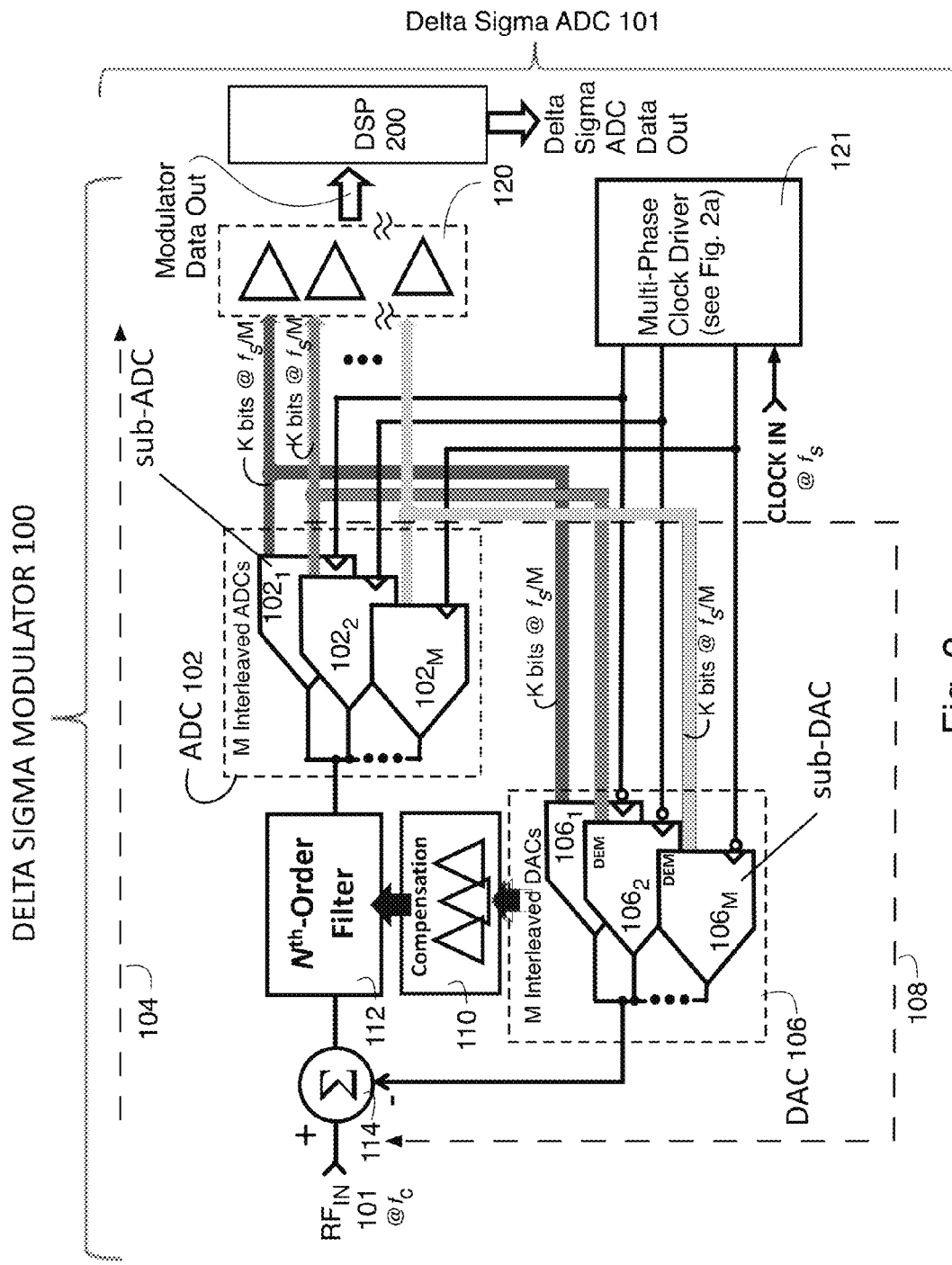
FIG. 2 is a block diagram of an embodiment of a $\Delta\Sigma$ modulator and a $\Delta\Sigma$ ADC incorporating the present invention.

A block diagram of the $\Delta\Sigma$ modulator 100 architecture of the present invention is illustrated by FIG. 2. The block diagram is shown for the most generic case: an Nth Order filter, an M time-wise interleaving factor, and K-bits in the quantizers of the depicted ADCs $102_1$-$102_M$ and the depicted DACs $106_1$-$106_M$ with a modulator clock rate of $f_s$. The architecture presented is different from a conventional continuous time $\Delta\Sigma$ modulator in that there is a bank 102 of interleaved Analog to Digital Converters (ADCs) $102_1$-$102_M$ in a forward path 104 and a bank 106 having an equal number of interleaved Digital to Analog Converters (DACs) $106_1$-$106_M$ in a feedback path 108. The input signal $RF_{IN}$ is applied to a summing block 114 with the feedback path being subtracted at that summing block 116. The analog input characteristics (amplitude, frequency) of the $RF_{IN}$ signal are encoded into a digital pulse stream which is applied to a DSP 200 which decimates the pulse string and when connected to the $\Delta\Sigma$ modulator 100 forms a $\Delta\Sigma$ ADC 101.

It should be noted that while FIG. 2 shows the input signal as being denominated as a RF or Radio Frequency signal, FIG. 2 and this invention may be used with an Intermediate Frequency (IF) signal instead. IF signals are produced, for example, by traditional superheterodyne receivers after one or more down conversions. As such, the input to summing block 114 may be an IF signal instead of an RF signal in certain embodiments, depending upon how the $\Delta\Sigma$ modulator 100 of FIG. 2 is utilized in practice. The disclosed modulator is capable of modulating the input signal 101 (RF or IF) having a carrier frequency $f_c$ of 1 GHz or more and a bandwidth of 20 MHz and doing so with a dynamic range of 60 dB. These values are not limits on the invention, rather what is attainable today using commercially available components. As technology improves, an even better interleaved Delta-Sigma ($\Delta\Sigma$) modulator capable of modulating even higher frequencies with even higher dynamic ranges will doubtlessly be possible following the teachings herein. Also, while the disclosed Delta-Sigma (ΔΣ) modulator is described herein as being useful with RF and IF signals (found in the radio art, for example), disclosed the Delta-Sigma (ΔΣ) modulator may be used in other applications outside of the radio arts if desired.

Bank 102 of ΔΣ modulator 100 of FIG. 2 may be referred to as an ADC herein while the individual ADCs $102_1$-$102_M$ may be referred to as either a plurality of ADCs or a plurality of sub-ADCs herein. Likewise bank 106 may be referred to as a DAC herein while the individual DACs $106_1$-$106_M$ may be referred to as either a plurality of DACs or a plurality of sub-DACs herein. All sub-ADCs $102_1$-$102_M$ are sampled at a reduced sampling rate of $f_s/M$ and likewise the sub-DACs are sampled at the same reduced sampling rate of $f_s/M$. The number M should be the same for both the sub-ADCs $102_1$-$102_M$ and sub-DACs $106_1$-$106_M$ and the number M reflects the extent of interleaving that is occurring here (which also correspond to the numbers of sub-ADCs $102_1$-$102_M$ and sub-DACs $106_1$-$106_M$ which are utilized in the embodiment of FIG. 2). Typical values of M are binary values, for example 2, 4, 8 etc. Interleaving the ADC has the same effect as demultiplexing in the time domain (in the case of sub-ADCs $102_1$-$102_M$) and interleaving the DAC has the same effect as multiplexing in the time domain (in the case of sub-DACs $106_1$-$106_M$). A lowered output data rate of $f_s/M$ eases the interface between the modulator of FIG. 2 and post-processing filter (a Digital Signal Processor or DSP 200) connected downstream of the modulator 100 shown in FIG. 2 thereby forming the Delta Sigma ADC 101. For example, if M=8 then the DSP 200 should be able to handle a clock rate of $f_s/8$ if the data rate is, for example 10 Gsps. If M=1 (and, hence no interleaving), then a hardware demultiplexer (demux) would likely be needed since a 10 Gsps data rate is probably too fast for current design DSPs. A track-and-hold circuit which commonly precedes interleaved ADCs is unnecessary because errors created in the forward path of the modulator are shaped by the feedback loop and have less consequence to the overall performance. Conversely, errors introduced in the feedback path from the sub-DACs $106_1$-$106_M$ should be addressed. There is no constraint on the filter order or type (e.g. bandpass or lowpass) of filter 112, however, the compensation network 110 for excess phase delay may become undesirably complex with higher order filters.

Figure 2A:
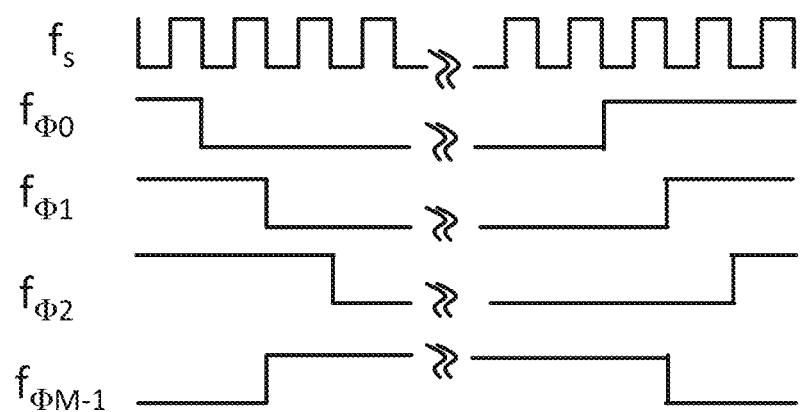
FIG. 2*a* is a timing diagram for a multi-phase clock driver of FIG. 2.

Interleaving occurs by controlling the clock inputs of the sub-ADCs $102_1$-$102_M$ and sub-DACs $106_1$-$106_M$ by means of a Multi-Phase Clock Driver 121. Exemplary clocks produced by the Multi-Phase Clock Driver 121 are exemplified in FIG. 2a which is a timing diagram of those clocks. FIG. 2a is a generalized illustration, and in the embodiment of the Multi-PhaseClock Driver 121 represented thereby, the clock phases are derived from the falling edge of the master clock ($f_s$). There will be pairs of clock signals that are 180 degrees out of phase with respect to one another, for example, $f_{\phi 1}$ and $f_{\phi M-1}$.

The filter 112 provides noise-shaping of the analog input signal $RF_{IN}$ by placing the zeroes of the filter noise transfer function around the input signal carrier frequency ($f_C$) thus suppressing the quantization noise around it. The filtered signal is then sampled and quantized by the ADC 102. The digital output signal is converted back to an analog signal by a DAC 106 and fed back to the input for subtraction at block 114 to form a closed-loop operation. Post-filtering of the digital output signal is preferably performed in the DSP 200 to remove the out-of-band portion of the quantization error. Sampling the filtered signal at a rate much higher than the input signal bandwidth, a technique known as oversampling, in conjunction with post-process filter functions results in an effectively high-precision modulator 100 despite the use of relatively coarse sub-ADCs $102_1$-$102_M$ and sub-DACs $106_1$-$106_M$. Coarse, in this context, means a few number of bits, such as, one to three. Preferably sub-ADCs $102_1$-$102_M$ and sub-DACs $106_1$-$106_M$ are each three bit devices. In comparison, a typical prior art ADC architecture would require 13 bits to achieve a dynamic range of 80 dB. With the disclosed circuits, a dynamic range of 80 dB can be achieved with sub-ADCs $102_1$-$102_M$ and sub-DACs $106_1$-$106_M$ implemented as three bit devices using a clock at $f_s$ with a suitably small jitter.

The Nth order filter 112 is also coupled to the inputs (or outputs) of the sub-DACs $106_1$-$106_M$ preferably via a compensation network 110, which will be described in greater detail with respect to the embodiment of FIG. 4 which shows a particular embodiment of filter 112 (which embodiment utilized an Nth order filter with N=6) in greater detail. Whether the Nth order filter 112 is coupled to the inputs or outputs of the sub-DACs $106_1$-$106_M$ is discussed later herein.

Between the sub-ADCs sub-ADCs $102_1$-$102_M$ and the DSP 200 is a block 120 labeled "Data Out". This block 120, as will be seen, will include a decoder, a demultiplexer and possibly also output buffers, which are not depicted here for ease of illustration. See, for example the embodiments of FIGS. 4 and 7 which depict such elements.

Interleaving alleviates many problems but complicates two aspects of the modulator design. The first problem is mismatch among the interleaved sub-DACs $106_1$-$106_M$. These sub-DACs $106_1$-$106_M$ are each a K-bit (multi-bit) DAC. And as noted above, errors in the feedback path 108 directly influence overall modulator 100 performance. Specifically, the dynamic range of the DACs $106_1$-$106_M$ must meet the requirements of the full modulator 100. A power-efficient Dynamic Element Matching (DEM) network for the interleaved DACs 106 may be utilized if desired. See FIG. 7.

FIG. 2(a) is a timing diagram for a multi-phase clock driver 115 of FIG. 2. In this generalized illustration, the clock phases are derived from the falling edge of the master clock $f_s$. There will be pairs of clock signals that are 180 degrees out of phase with respect to one another, for example, as in the case of $f_{\phi 1}$ and $f_{\phi M-1}$. For an interleaving of M=2, the clock phases ($f_{\phi 1}$ and $f_{\phi 2}$) are half of the master clock frequency ($f_s$) and are 180 degrees out of phase with one another.

Figure 4:
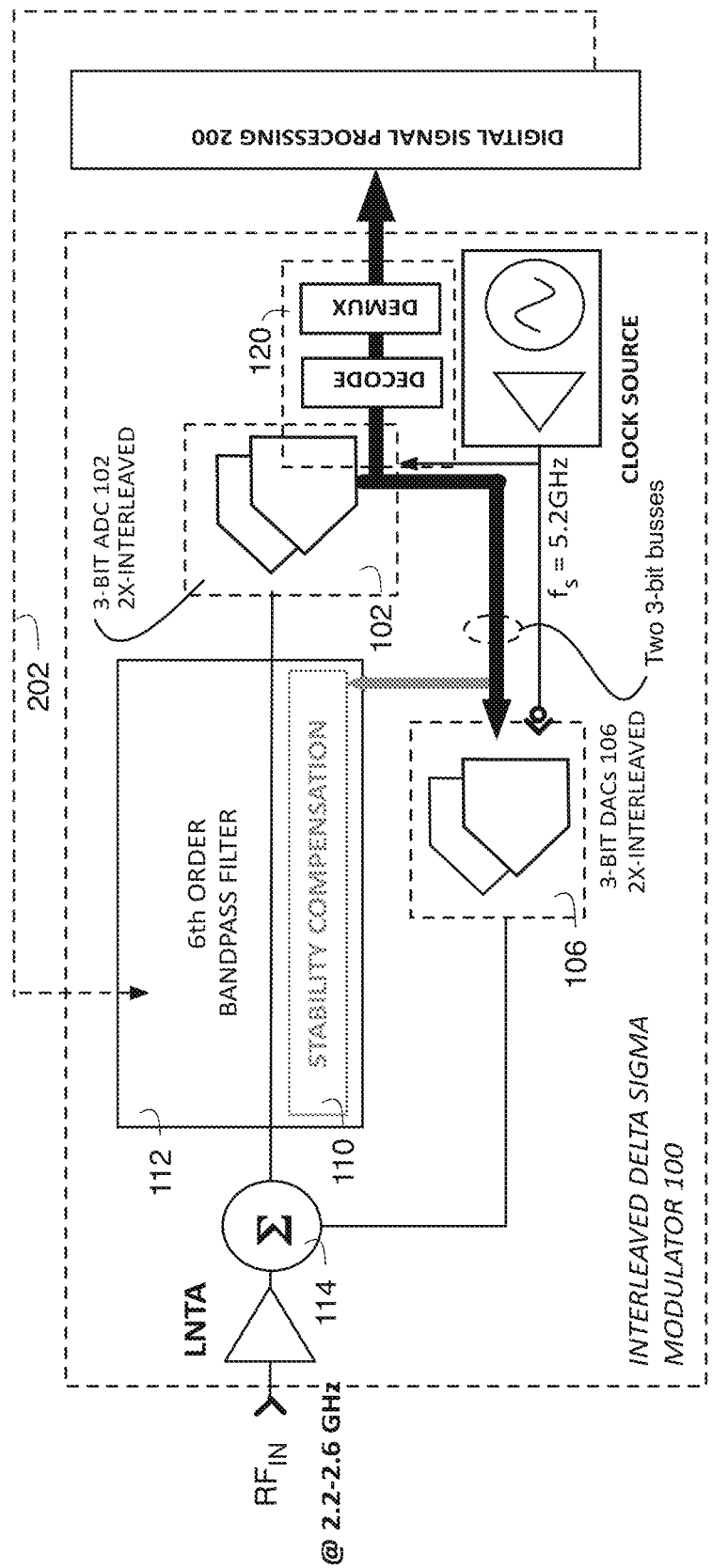
FIG. 4 is a block diagram of a $\Delta\Sigma$ modulator in accordance with a more specific embodiment the present invention where K=3, M=2 and N=6.
Figure 4A:
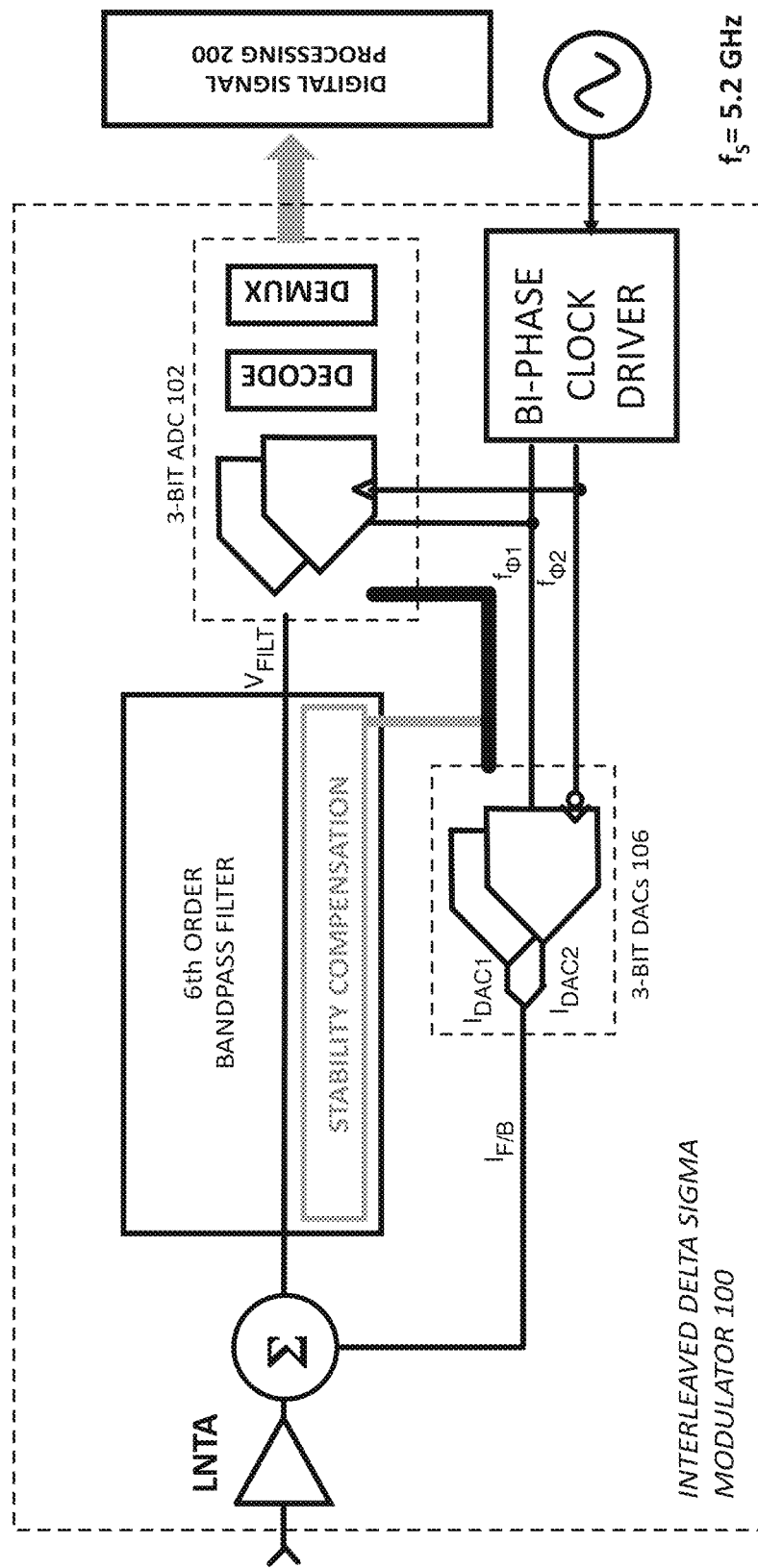
Figure 4B:
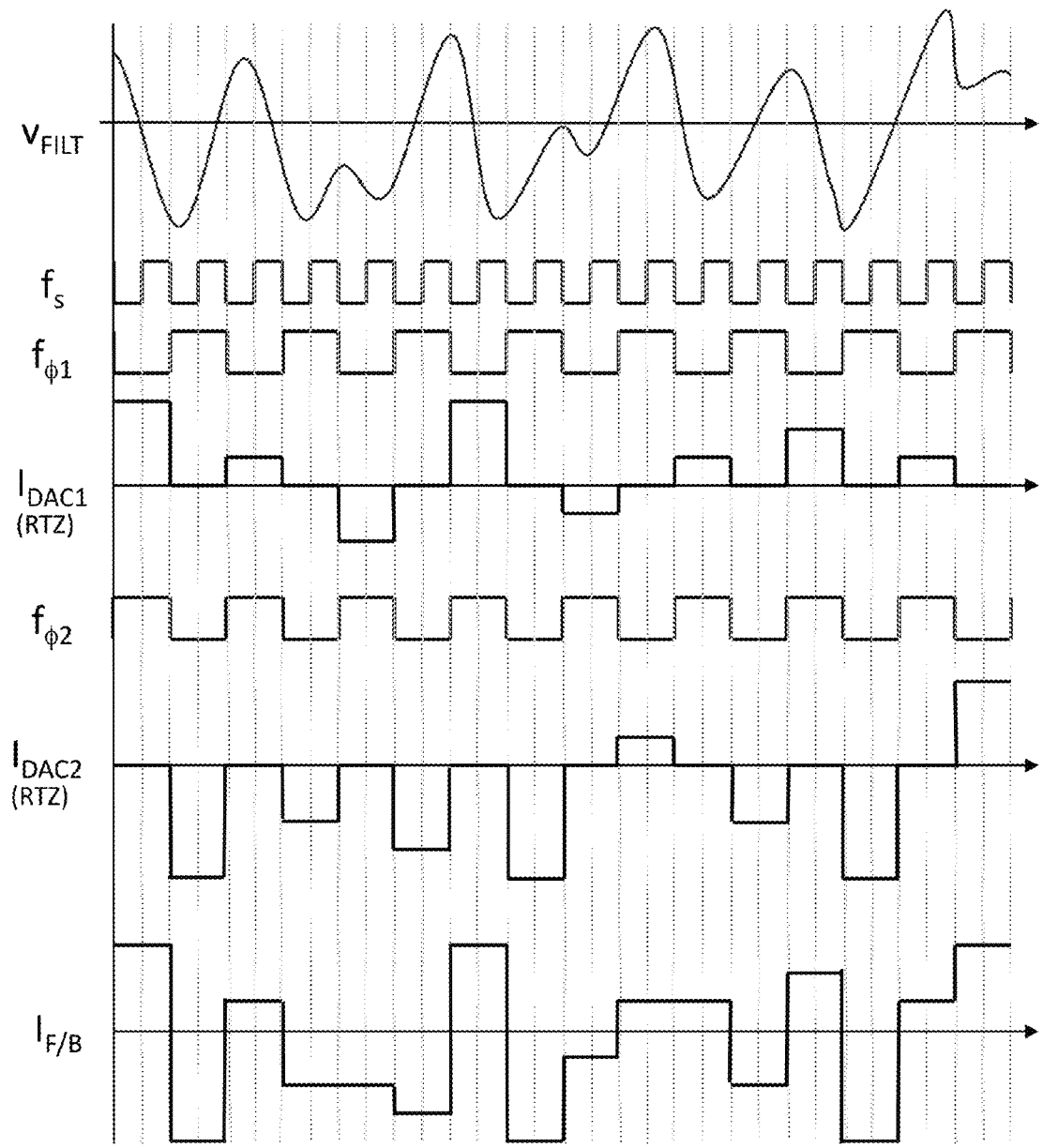

FIG. 4(b) is a timing diagram the interleaved clocks and signals and corresponds to the embodiment of FIG. 4. The signals shown on FIG. 4(b) are related back to the embodiment of FIG. 4 by FIG. 4(a) which is similar to FIG. 4, but the signals are labeled thereon to correspond with the timing diagram of FIG. 4(b). The exemplary timing diagram of FIG. 4(b) uses return-to-zero (RTZ) DACs which null the output current when the sample is not being evaluated. When RTZ sub-DACs are used, the output currents can be summed to produce the feedback current IF/B. The use of non-return-to-zero (NRZ) DACs instead of RTZ sub-DACs would add complexity to the design.

The second problem introduced by interleaving is the effective increase in phase delay through the loop. FIGS. 3(a) and 3(b) illustrate the increased challenge of excess loop delay in an interleaved architecture. The delay can degrade the performance of the loop and too much delay can result in an unstable modulator. Any practical ADC takes time to make a decision. Thus, the feedback DAC will have to be clocked at a time τD delayed from the sampling instant of the ADC as illustrated by FIG. 3(a). Since the ADCs in the proposed interleaved designs have a sampled clock period (which is the inverse of the frequency) that is multiplied by the interleaving order (yielding $f_s/M$), the excess phase delay increases proportionally, since as is mentioned on FIG. 3(b), the reduced sampling rate in an interleaved design causes a multiplicative effect on excess loop delay. The compensation network employs techniques for mitigating the effects of the increased loop delay to restore the ideal noise transfer function. Such techniques as adding a direct path around the 1-bit feedback paths to interstage summation nodes in the filter and tuning the filter coefficients of filter 112 may be employed.

Figure 3C:
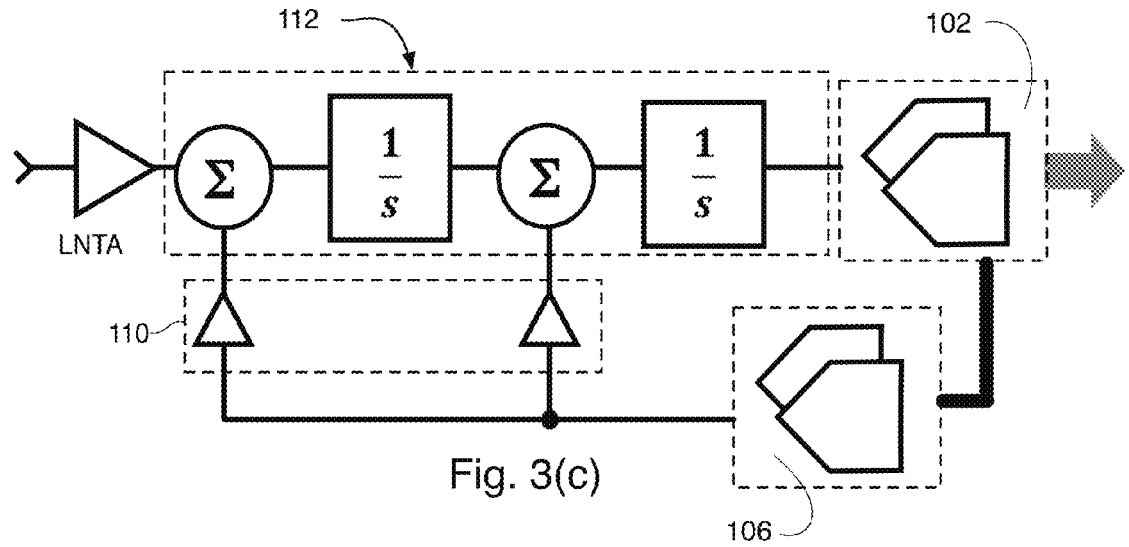
FIG. 3(*a*) illustrates that the feedback DAC will have to be clocked at a time TD delayed from the sampling instant of the ADC.
Figure 3D:
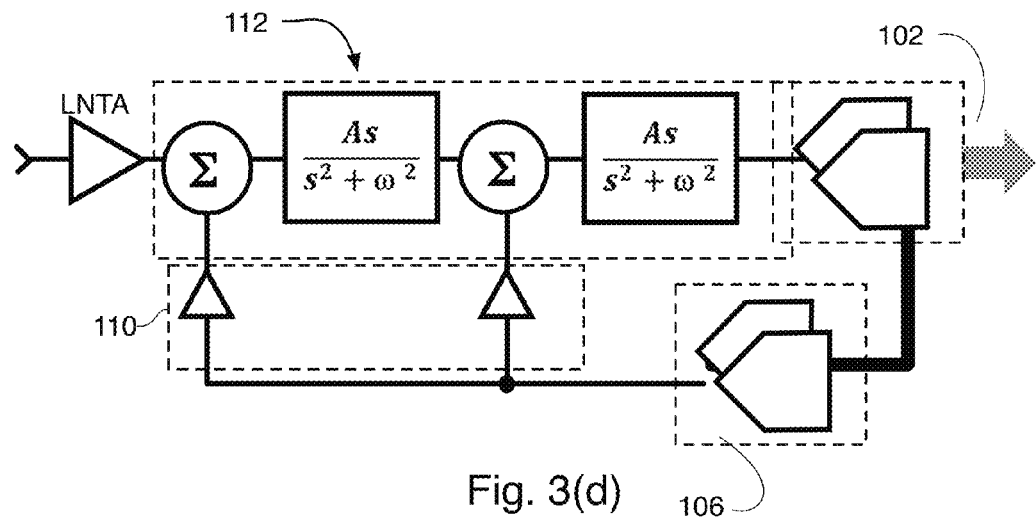

FIGS. 3(c) and 3(d) show that interleaving the sub-ADCs and sub-DACs in a delta-sigma modulator 100 is not restricted to utilizing a band-pass filter 112 (see the band pass embodiment of filter 112 in FIG. 3(d)). The interleaving with a low-pass filter 112 embodiment (see the filter 112 of FIG. 3(c)) can offer a higher oversampling ratio to thereby obtain a further increase in dynamic range.

The proposed architecture is currently being reduced to practice for applications up to the cellular frequency band of 2.2 to 2.6 GHz. See FIG. 4 which is a block diagram of a ΔΣ modulator in accordance with a more specific embodiment the present invention where K=3, M=2 and N=6. Modulator design parameters are being chosen as a compromise between aggressive dynamic range goals (>100 dB), low power dissipation (<500 mW), and practical technology limits. A summary of the modulator being reduced to practice is provided in in Table I below and a simplified block diagram is shown in FIG. 4.

TABLE I

Modular Design Parameters for the embodiment of FIG. 4

| Parameter | | Reasoning |
|---|---|---|
| Filter Order of Filter 112 | N = 6 | Passive resonator approach must have even order and N = 4 is insufficient to reach our dynamic range goals |
| Interleave Factor | M = 2 | Optimum trade-off between power and the reduced sampling rate $f_s/M$ |
| Quantizer Bits of the ADCs 102 and DACs 106 | K = 3 | Compromise between DAC performance and achievable modulator dynamic range. |

Figure 5:
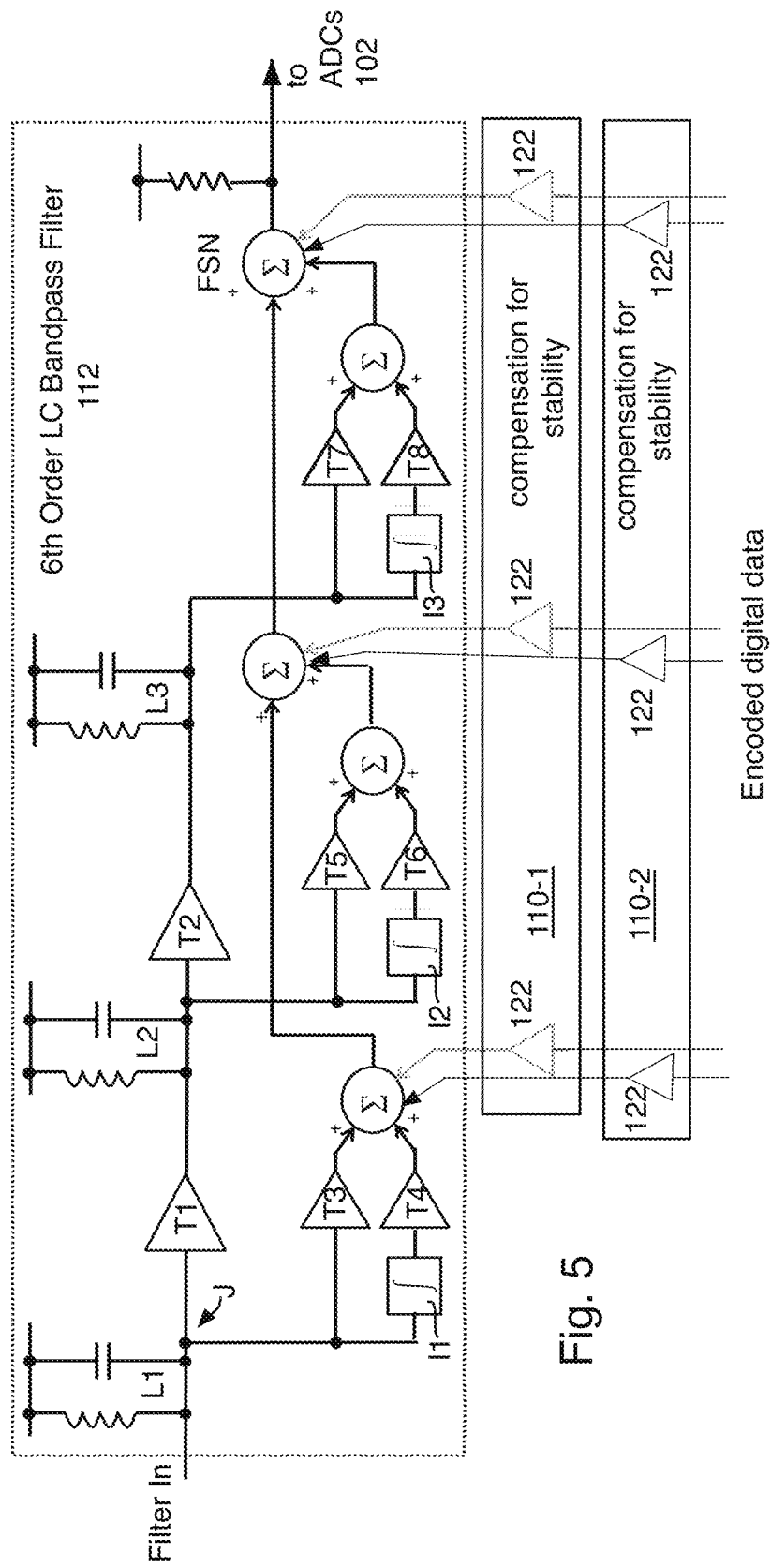
FIG. 5 depicts an embodiment of the 6th order filter utilized in the embodiment of FIG. 4 and also depicts an embodiment of the compensation network.

A first embodiment of the $6^{th}$ order filter 112 of the embodiment of FIG. 4 is shown in greater detail by FIG. 5. The filter 112 of the embodiment of FIG. 5 has three passive resonators L1-L3, multiple transconductance amplifiers T1-T8, and three integrators I1-I3. The configuration of the filter 112 in this embodiment is a feed-forward architecture—signals are being fed from earlier resonator stages into the final summing node FSN. Though a feedback architecture may offer more out-of-band noise shaping, a feed-forward architecture gives more flexibility in designing a stable modulator. This embodiment utilizes passive resonators L1-L3 because they have lower noise figures, higher linearity, require less power, and can operate at higher carrier frequencies than active resonators. Of course, some may elect to use active filters and/or a feedback architecture for the filter 112 if they wish. The quality factor, or Q, of each resonator L1-L3 is primarily set by the (inherent) series resistance of the inductor in each resonator. The tank values, amplifier transconductances, and integrator parameters of the filter can be determined by defining the desired noise transfer function, extracting the coefficients from the expression, then translating the coefficients into circuit parameters.

Exemplary values for the inductors and capacitors making up resonators L1-L3 for a filter 112 having a passband from 2.0 to 2.4 GHz are given in Table II below

TABLE II

Exemplary Inductor and Capacitor Values for L1-L3

| L1 | L2 | L3 |
|---|---|---|
| 2.5 nH | 2.5 nH | 2.5 nH |
| 3.62 pF | 3.70 pF | 3.74 pF |

The compensation network 110 (two identical networks 110-1 and 110-2 are depicted for the embodiment of FIG. 5, one for each of the two 3-bit busses since M=2 in the embodiment of FIG. 4) is a generalized diagram showing three DACs 122 being driven by encoded digital data (from the inputs of DACs $106_1$ and $106_2$—see FIG. 4) and feeding back to internal filter nodes of the filter 112. In the simplest form, each compensation network 110-1 and 110-2 might comprise a plurality of single 1-bit DACs 122 each driven by the most significant bit from one of sub-ADCs $102_1$ and $102_2$ and feeding back to the final summation node FSN of the filter 112. The depiction of FIG. 5 is more generalized in that there is a separate 1-bit DAC for each of the 3 bits of each of the two 3-bits busses in the depicted embodiment of the compensation network 110. Also, the depicted 1-bit DACs could be connected to the outputs of sub-DACs $106_1$ and $106_2$ instead of their inputs. However, the 1-bit DACs are preferably connected to the inputs of sub-DACs $106_1$ and $106_2$ since, at the inputs of sub-DACs $106_1$ and $106_2$, the digital codes are voltage values while while at the outputs the data there is expressed in values of current.

Figure 5A:
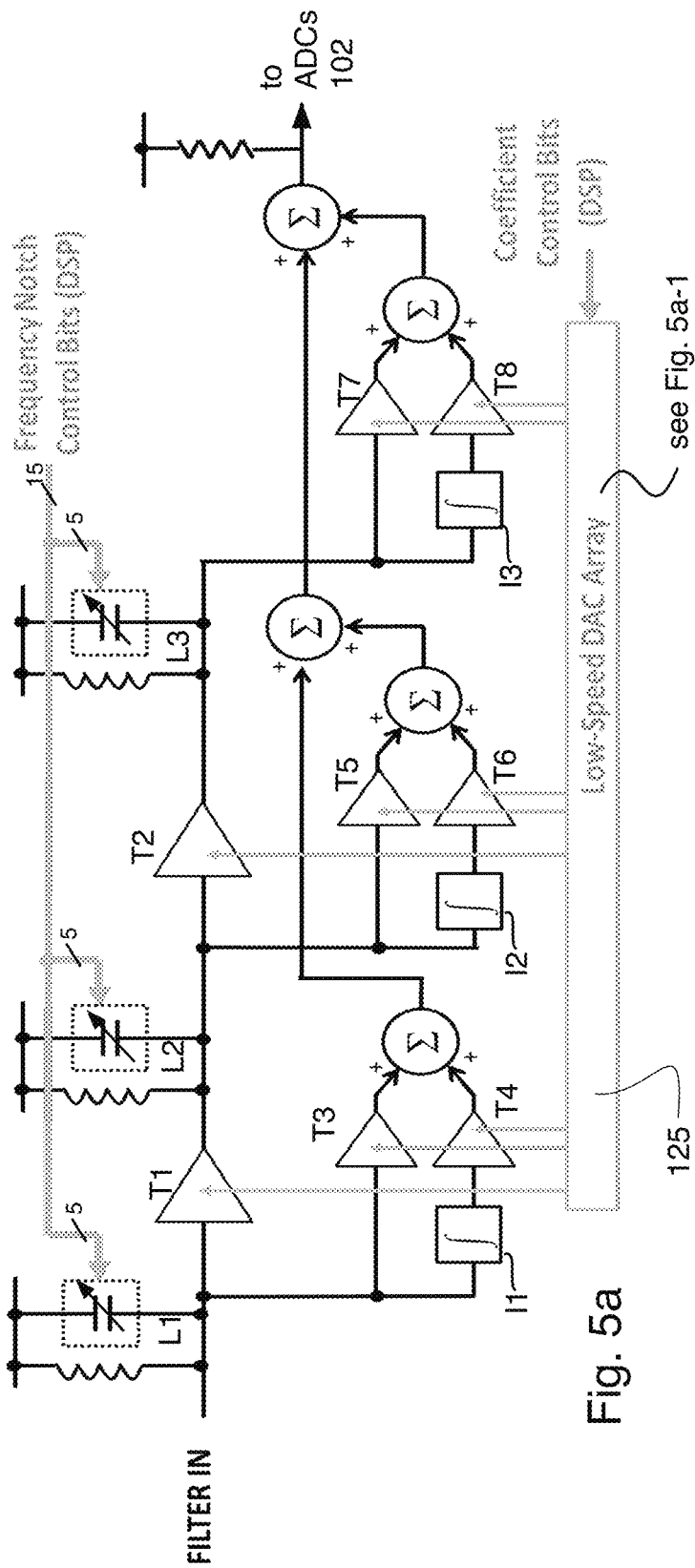
FIG. 5*a* depicts an embodiment of the 6th order filter utilized in the embodiment of FIG. 4 (which would preferably include, but does not show the compensation compensation network of FIG. 5), but shows control signals from the DSP for controlling the frequencies of the depicted LC networks and gains of the depicted trans conductors.
Figures 1, 5A:
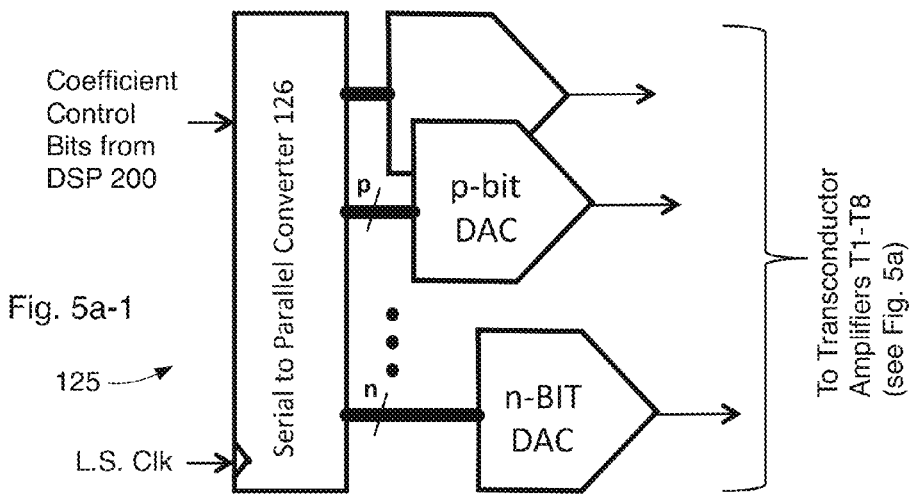

The embodiment of filter 112 shown in FIG. 5 has fixed resonators L1-L3 and the gains of the transconductance amplifiers T1-T8 are also fixed. However more design flexibility results if the frequencies of the tank circuits (resonators) L1-L3 can be varied and if the gain of the transconductance amplifiers T1-T8 can likewise be varied. Such an embodiment of the filter is depicted by FIG. 5a. Turning to FIG. 5a, this figure depicts an embodiment of the filter 112 for tuning across a band of carrier frequencies (fc). Frequency notch control data, preferably in the form of bits from DSP 200, are sent to control variable capacitors in the L1-L3 resonators to change the values of capacitance and thereby affect a change in the filter's notch frequency. To keep the modulator stable, coefficients, which are applied to the transconductance amplifiers T1-T8, modify their gains which gains are preferably varied as the notch changes location within the bandpass filter. The embodiment of FIG. 5a preferably continues to utilize compensation networks 110-1 and 110-2 shown in FIG. 5, but which they not depicted on FIG. 5a simply for ease of illustration.

In the embodiment of FIG. 5a frequency notch control bits preferably provided by DSP 200 control the resonant frequencies of resonators L1-L3 by varying the depicted variable capacitors. To do that, each depicted variable capacitor preferably comprises a bank of capacitors which are switched in or out of each resonator according to a multi-bit digital code from DSP 200. Alternatively, or in addition, the depicted inductor in each resonator L1-L3 may effectively be made variable by providing a bank of inductors which are switched in or or of the resonator by a multi-bit digital code from DSP.

The bank of capacitors (or inductors) may comprises, for example, a bank of 32 capacitors (or inductors) which can be be switched in and out of the resonator by a five bit code from the DSP 200. If 32 capacitors and 32 inductors are utilized in each resonator, then both capacitors and inductors can be switched in and out, and the frequency notch control data should then be a ten bit code for each resonator.

Figure 1:
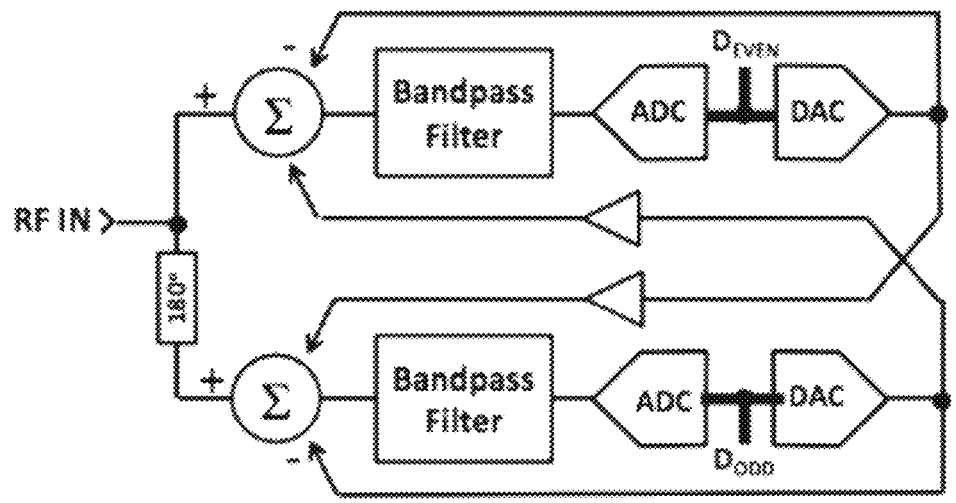
FIG. 1(*a*) depicts a simplified representation of a prior art $\Delta\Sigma$ modulator.
Figure 1:
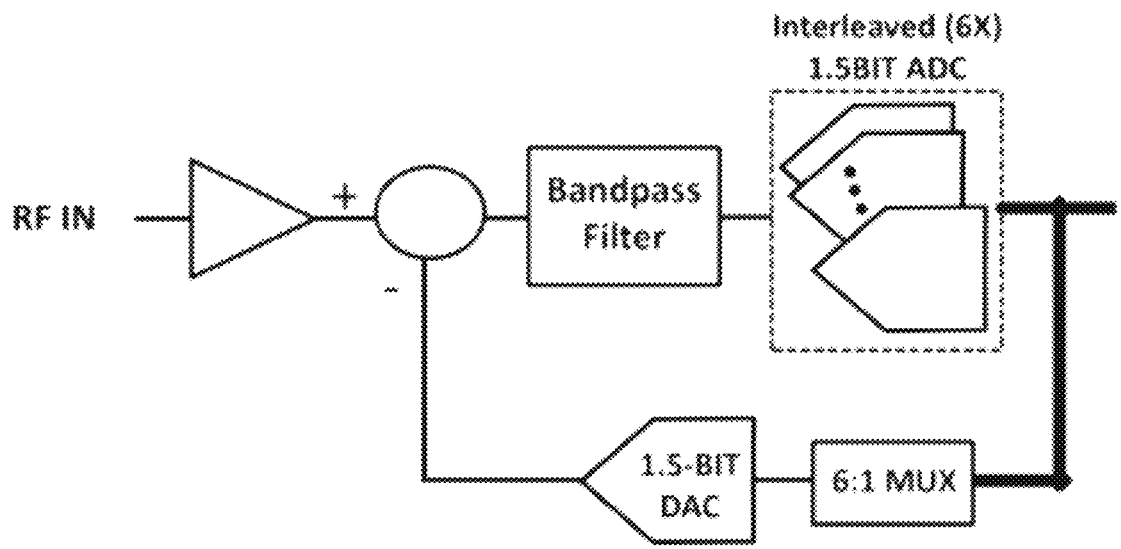

The gains of the transconductance amplifiers T1-T8 are preferably also controlled from the DSP 200 in the embodiment of FIG. 5a as the notch and the desired carrier frequency changes. FIG. 5a includes a block 125 labeled Low Speed DAC Array. The Low Speed DAC Array 125 is shown in greater detail by FIG. 5a-1. In FIG. 5a-1 a single-bit digital data stream from DSP 200 is applied to a serial to parallel converter 126 along with a clock (which may a relatively slow speed in the kHz to low MHz range). The parallel outputs of the serial to parallel converter 126 are applied to a number of multi-bit DACs 128, one for each of the transconductance amplifiers T1-T8. The number of bits converted by each DAC 128 need not be the same. Some DACs may convert more bits that other DACs 128, so one is labeled a p-bit DAC while another one is labeled a n-bit DAC. The number of bits converted by each DAC 128 will depend on the amount of coarseness tolerated in applying the aforementioned coefficients to the transconductance amplifiers T1-T8.

Figures 1, 6A:
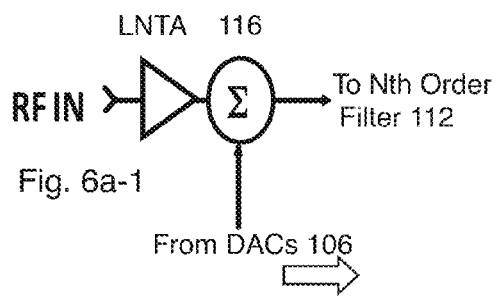
Figures 1, 6B:
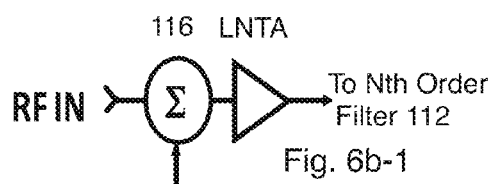
Figures 2, 6A:
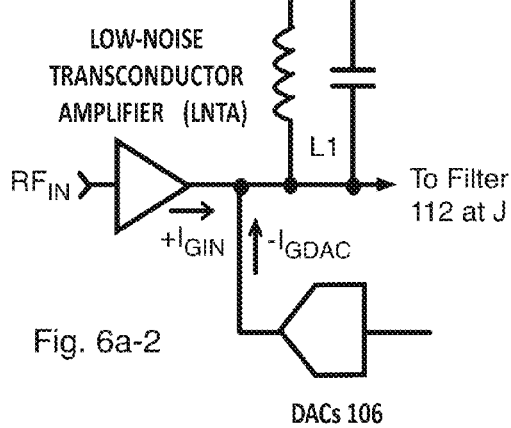
Figures 2, 6B:
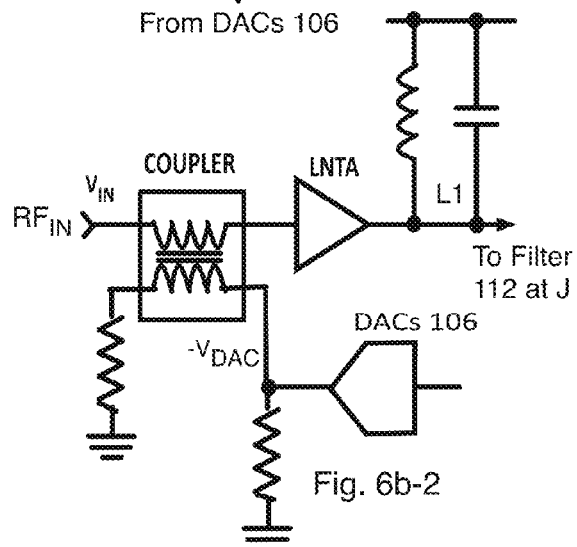

In the embodiment of FIG. 4 the Low-Noise Transconductance Amplifier (LNTA) is depicted as occurring prior to the summing block 116. This summing block 116 LNTA combination is shown schematically again by FIG. 6a-1 and FIG. 6a-2 depicts in greater detail how those summing block 116 might be implemented. The LNTA can occur after the summing block 116 as is schematically shown by FIG. 6b-1 while FIG. 6b-2 depicts in greater detail how the summing block 116 in that embodiment might be implemented.

These two approaches (see FIGS. 6a-1 and 6b-1) for subtracting the feedback signal coming from the DACs 106 from the input signal $RF_{IN}$. "Subtraction" is really the summation of the inverted feedback value with the input signal $RF_{IN}$. The summation can be done as a current summation or voltage summation. Current summation is a broadband operation—the junction does not introduce delay and will not limit bandwidth. The disadvantage is that a higher signal amplitude is presented to the LNTA making it a more difficult component to design. When the subtraction precedes the LNTA as shown in the embodiment of FIGS. 6b-1 and 6b-2, only the error signal is presented to the LNTA so higher dynamic range operation is possible. Additionally the coupler can have a dual-use when RF cancellations are needed. The disadvantage of this approach is that the coupler adds delay and may cause the modulator 100 to be unstable. The first resonator L1 of the filter 112 is depicted in FIGS. 6a-2 and 6b-2 for clarity of understanding. So the outputs of these circuits of FIGS. 6a-2 and 6b-2 are applied at junction J of FIG. 5 since there is no need to repeat the first resonator L1.

Figure 7:
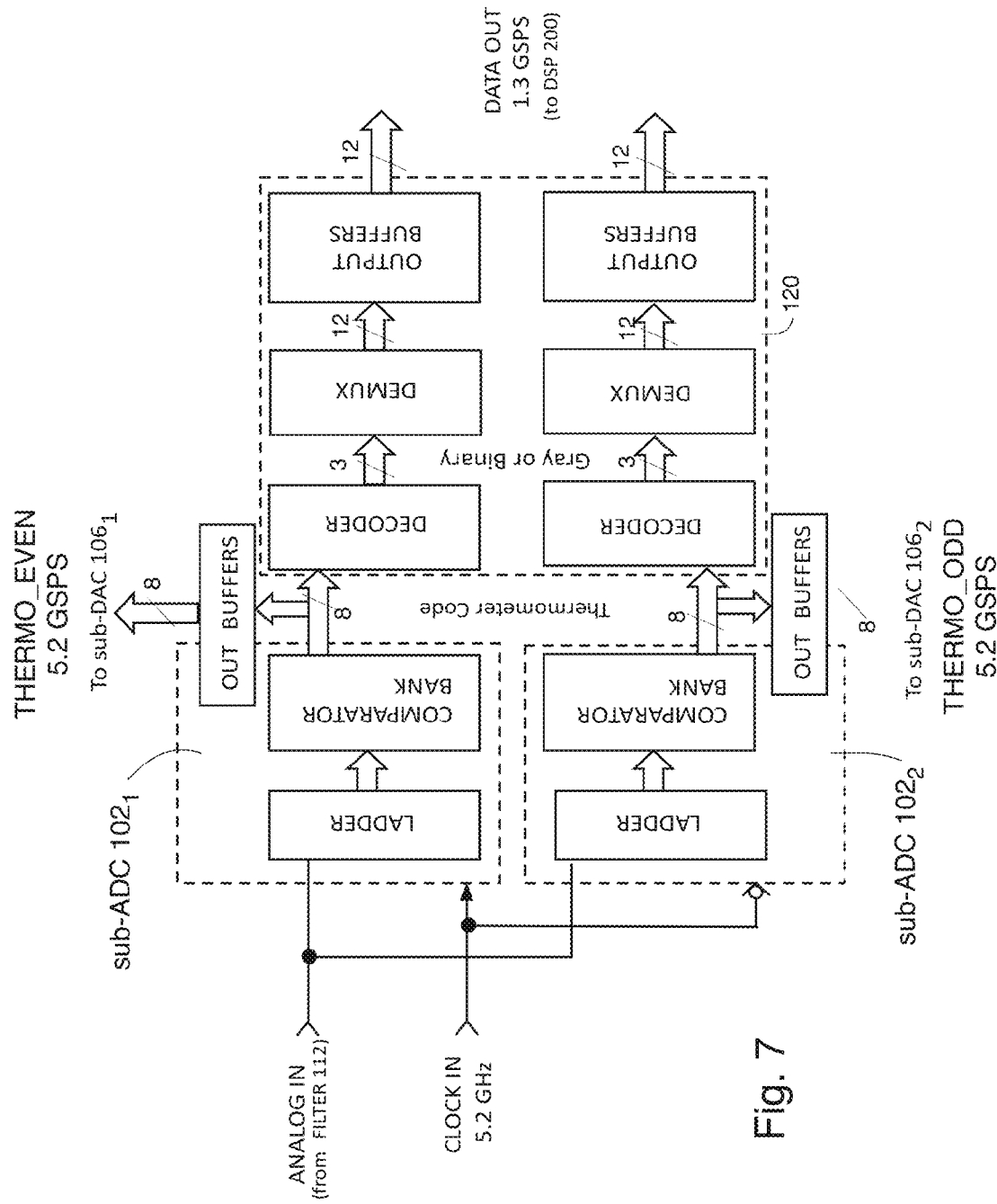
FIG. 7 is a block diagram showing the interleaving of two sub-ADCs.

FIG. 7 is a block diagram showing the interleaving of two sub-ADCs using preferably using flash architectures devices. Each sub-ADC $102_1$ and $102_2$ has a ladder and comparator bank to generate a thermometer code for the downstream sub-DACs $106_1$ and $106_2$. The decoders convert the thermometer code to binary to reduce the I/O count from 8 to 3 and the demultipexer (DEMUX) reduces the output data rate so that the DSP 200 can process the modulator 100 data. The sub-ADCs $102_1$ and $102_2$ are clocked 180 degrees out of phase with respect to each other and thus alternately sample the input analog data (from Filter 112). Sample-and-hold amplifiers (SHA) are commonly used at the front-end of an interleaved ADC to minimize timing errors but are challenging designs since they must operate at the full clock rate of 10.4 GHz in this embodiment. Errors introduced in the feedback path of the modulator, such as non-linearities from a multi-bit DAC, directly affect the performance of the modulator whereas errors in the forward path of the modulator are shaped by the closed loop feedback configuration. Since the errors of the sub-ADCs $102_1$ and $102_2$ are shaped by the modulator, the SHAs may be omitted when the interleaved ADCs are used in the disclosed modulator 100. Each sub-ADC is clocked at 5.2 GHz in this embodiment and produce a thermometer code at 5.2 Gigasamples per second (5.2 Gsps).

Figure 8:
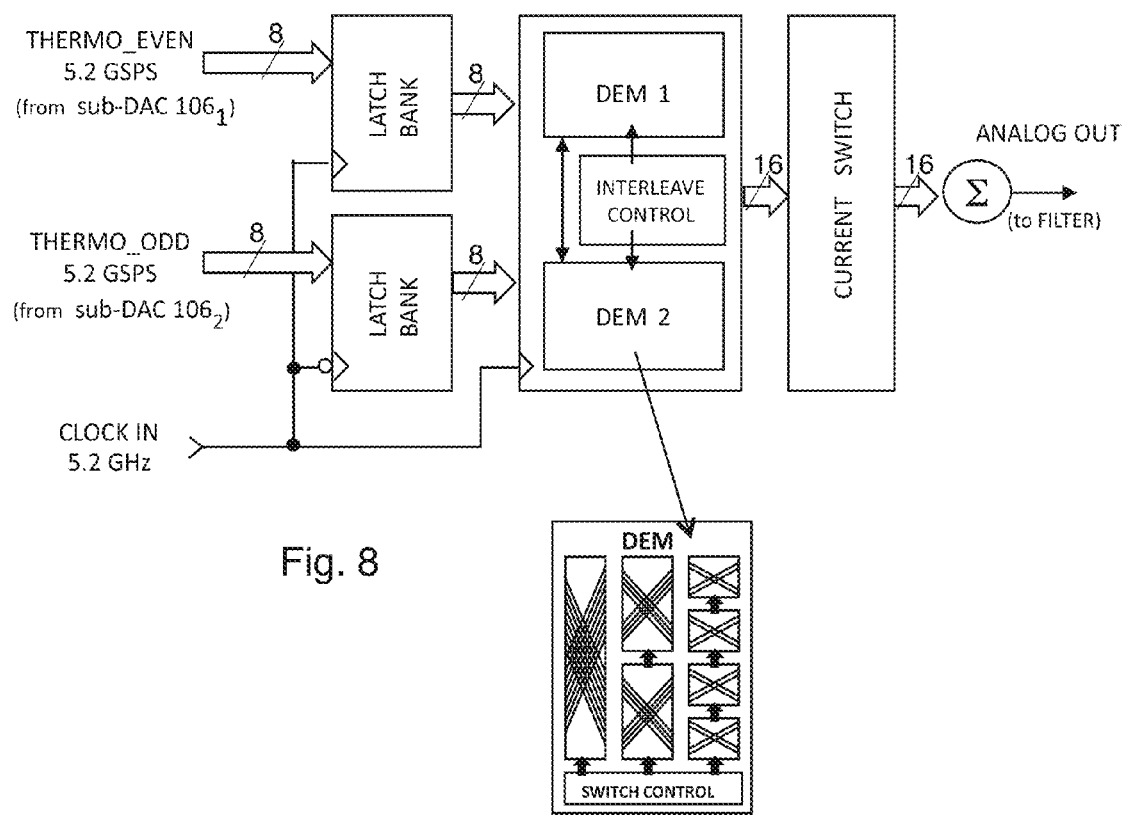
FIG. 8 illustrates the fact that the interleaving of the DACs will preferably utilize an algorithm to interleave the separate Dynamic Element Matching (DEM) blocks.

FIG. 8 illustrates the fact that the interleaving of the DAC will preferably utilize an algorithm to interleave the separate Dynamic Element Matching (DEM) blocks. The randomized outputs of the DEM block will drive the depicted unary current source switches. Only the output summation block need support 10.4 Gsps operation assuming a M=2 interleave with a 5.2 Gsps thermometer code going into the DAC. Dynamic element matching has been well studied in literature. See, for example, the article by Ian Galton, "Why Dynamic-Element-Matching DACs Work", *IEEE Transactions on Circuits and Systems—II: Express Briefs*, Vol. 57, No. 2, February 2010, pp. 69-74 incorporated herein by reference. The idea is to "randomly" assign the connection between a latch and a unary current source. By doing this, any errors from process mismatch in making the DACs get distributed so spurious signals start to look like flat white noise and the dynamic range improves. DEM is well known in the art of DAC design and therefore it is not further discussed here.

Figure 9:
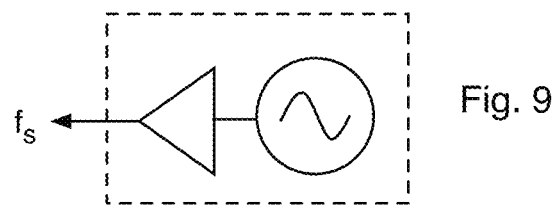
FIG. 9 illustrates the a precision clock should be used with the disclosed $\Delta\Sigma$ modulator.
Figure 9A:
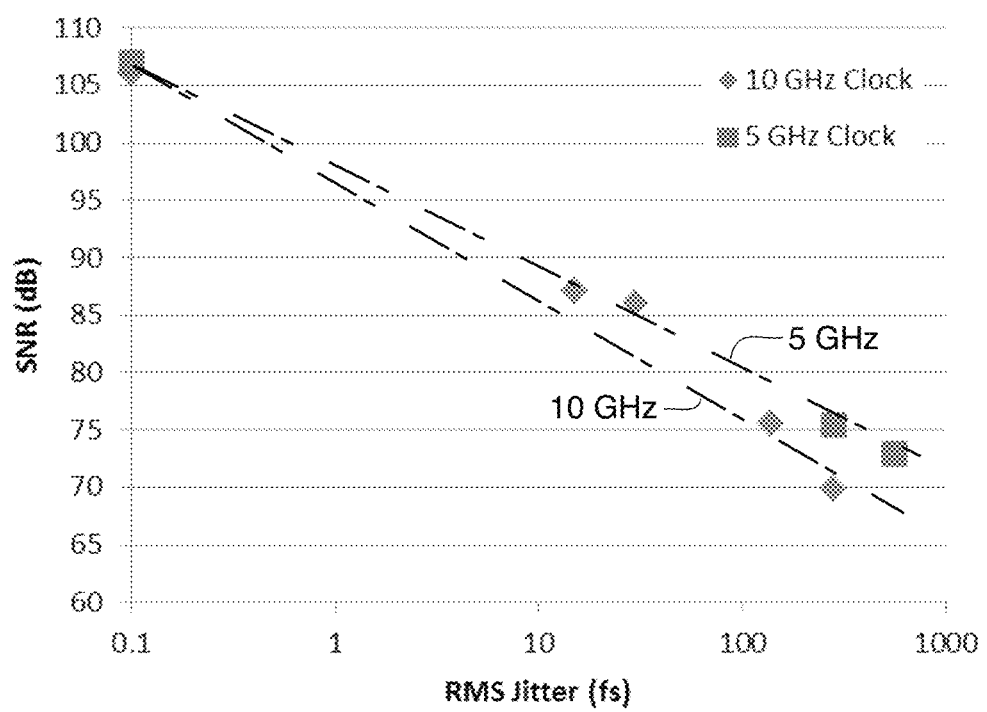

FIG. 9 depicts the clock source $f_s$ which needs to have ultra low jitter or ultimately the clock source will establish the noise floor and the noise from clock source is not shaped by the modulator. FIG. 9(a) is a plot showing the effect of clock jitter from a 5-GHz and 10-GHz clock source on SNR of an ideal 3-Bit DAC driven by a delta-sigma modulated signal. The trend shows a degradation in SNR of about 6 dB for every doubling of the clock jitter. To attain 80 dB of dynamic range, the clock generating $f_s$ should have less than 30 fsec of RMS clock jitter based on the phase noise of the clock beyond 100 KHz. Such clocks are commercially available from Crystek of Fort Myers, Fla., and a high quality clock with low jitter clock with relatively low jitter should be utilized if a high dynamic range of, say, 80 dB is desired.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ".

What is claimed is:

1. A modulator comprising:
   a. a forward path coupling a input summing block with an data out block, the forward path including at least a Nth order filter coupled to said input summing block and a plurality of interleaved multi-bit Analog to Digital Converters (ADCs), the interleaved multi-bit ADCs the having inputs which are coupled to said Nth order filter and outputs which are coupled to said data out block; and
   b. a feedback path including a plurality of interleaved multi-bit Digital to Analog Converters (DACs), the interleaved multi-bit DACs having inputs which are coupled to respective outputs of the interleaved multi-bit ADCs, the interleaved multi-bit DACs having outputs which are summed together and applied to said input summing block, with connections between the interleaved multi-bit DACs and the Nth order filter.

2. The modulator of claim 1 wherein the data out block includes at least a decoder and a demultiplexer coupled in series between the outputs of the interleaved multi-bit ADCs and an output of the modulator, the decoder having a plurality of inputs coupled directly to the outputs of the interleaved multi-bit ADCs.

3. The modulator of claim 2 wherein the interleaved multi-bit ADCs output digital data in a thermometer code and the decoder translates thermometer coded data from the interleaved multi-bit ADCs into a gray or binary code.

4. The modulator of claim 1 wherein the input summing block combines an input RF stream of analog data to the modulator with the outputs of the interleaved multi-bit DACs, so that, in use, analog data at the outputs of the interleaved multi-bit DACs is subtracted from the input RF stream of analog data.

5. The modulator of claim 4 wherein the input summing block includes a Low Noise Transconductance Amplifier (LNTA) which has an input thereof coupled to the input RF stream of analog data and an output connected to the outputs of the interleaved multi-bit DACs and to an input of the Nth order filter.

6. The modulator of claim 4 wherein the input summing block includes a coupler having inputs coupled to the input RF stream of analog data and to the outputs of the interleaved multi-bit DACs and at least one output, the input summing block further including a Low Noise Transconductance Amplifier (LNTA) which has an input thereof coupled the at least one output of said coupler and having an output coupled to an input of the Nth order filter.

7. The modulator of claim 1 wherein the connections from the interleaved multi-bit DACs to the Nth order filter include at least one stability compensation circuit coupled to a plurality of summing nodes within said Nth order filter.

8. The modulator of claim 7 wherein the stability compensation circuit has inputs coupled at the inputs of the interleaved multi-bit DACs and a plurality of outputs individually coupled to said plurality of summing nodes in said Nth order filter.

9. The modulator of claim 8 wherein a final summing node in said Nth order filter receives the most significant bits available at the inputs of the interleaved multi-bit DACs via a plurality of one-bit DACs.

10. The modulator of claim 7 wherein the stability compensation circuit has a plurality one-bit DACs coupling data available at the inputs of the interleaved multi-bit DACs to said plurality of summing nodes within said Nth order filter.

11. The modulator of claim 7 wherein the stability compensation circuit has a plurality one-bit DACs coupling data available at the outputs of the interleaved multi-bit DACs to said separate summing nodes within said Nth order filter.

12. The modulator of claim 1 wherein the Nth order filter is a bandpass filter.

13. The modulator of claim 1 wherein the Nth order filter is a lowpass filter.

14. The modulator of claim 12 wherein the Nth order filter is a 6th order filter having three resonant circuits therein.

15. The modulator of claim 12 wherein the plurality of interleaved multi-bit ADCs comprise a pair of interleaved three-bit ADCs, wherein the plurality of interleaved multi-bit DACs comprise a pair of interleaved three-bit DACs.

16. The modulator of claim 1 wherein the plurality of interleaved multi-bit ADCs comprise a plurality of ladder circuits each coupled in series with a comparator circuit for generating a digital thermometer code corresponding to analog data provided to said ladder circuits.

17. The modulator of claim 1 wherein the Nth order filter has a plurality, and preferably N/2, resonators coupled in series between a filter input and a filter output t.

18. The modulator of claim 17 wherein the resonators have fixed resonate frequencies.

19. The modulator of claim 17 wherein the resonators have variable resonate frequencies set by digitally controlled filter values.

20. The modulator of claim 19 wherein the digitally controlled filter values are derived from a digital signal processor coupled to said data out block.

21. The modulator of claim 18 further including a plurality of multi-bit DACs having inputs controlled by said digital signal processor and having outputs coupled to the plurality of transconductance amplifiers in said Nth for filter for controlling the gains thereof.

22. A analog to digital converter comprising the modulator of claim 2 and a decimator coupled to the output of the modulator of claim 2.

23. A method increasing the dynamic range of a $\Delta\Sigma$ modulator comprising:
   providing a plurality of ADCs and a plurality of DACs, the plurality of ADCs and DACs being connected in a loop, wherein the number of ADCs in said plurality of ADCs is equal to M;
   coupling the plurality of ADCs with an incoming analog signal having a maximum frequency f;
   controlling said plurality of ADCs and plurality of DACs with a plurality of clock signals each having a frequency equal to a multiple of f, the clock signals in said plurality of clock signals being offset relative to each other in the time domain thereby enabling each ADC in said plurality of ADCs one at a time and enabling each DAC in said plurality of DACs one at a time such that the ΔΣ modulator processes data in said incoming analog signal in an interleaved fashion;

increasing a number of bits processed in parallel by each ADC in said plurality of ADCs and each DAC in said plurality of DACs such that each each ADC in said plurality of ADCs is a multibit ADC and each DAC in said plurality of DACs is a multibit DAC; and applying the incoming analog signal to a summing junction along with outputs from the plurality of DACs and filtering data output from the summing junction by an Nth order filter having a plurality of internal summing junctions, the internal summing junctions also being connected with said plurality of DACs, and applying an output of the Nth order filter to the plurality of ADCs in said interleaved fashion.

24. The method of claim 23 wherein the number of bits processed a one time by each of said ADCs is equal to K, with M preferably being equal to 2 and K preferably being equal to 3.

25. The modulator of claim 1 wherein said connections occur externally of said summing block between the interleaved multi-bit DACs and the Nth order filter.

26. The modulator of claim 25 wherein the connections include a plurality one-bit DACs coupling data available at the inputs of the interleaved multi-bit DACs to summing nodes within said Nth order filter.

27. The modulator of claim 1 wherein said Nth order filter is tunable, wherein a DSP is coupled to the data out block and wherein bits generated by the DSP tune a notch frequency of said Nth order filter.

28. The method of claim 23 wherein M equals 2, 4 or 8.

* * * * *